US008811665B2

(12) United States Patent
Opower et al.

(10) Patent No.: US 8,811,665 B2
(45) Date of Patent: Aug. 19, 2014

(54) PROCESSING SYSTEM

(75) Inventors: Hans Opower, Krailling (DE); Klaus Juenger, Hennef (DE)

(73) Assignee: KLEO Halbleitertechnik GmbH, Tettnang (DE)

( * ) Notice: Subject to any disclaimer, the term of this patent is extended or adjusted under 35 U.S.C. 154(b) by 259 days.

(21) Appl. No.: 13/332,467

(22) Filed: Dec. 21, 2011

(65) Prior Publication Data

US 2012/0163660 A1 Jun. 28, 2012

Related U.S. Application Data

(63) Continuation of application No. PCT/EP2010/059284, filed on Jun. 30, 2010.

(30) Foreign Application Priority Data

Jul. 3, 2009 (DE) .......................... 10 2009 032 210

(51) Int. Cl.
G06K 9/00 (2006.01)
G03F 7/20 (2006.01)
G03F 9/00 (2006.01)

(52) U.S. Cl.
CPC .............. G03F 7/70791 (2013.01); G03F 9/00 (2013.01)
USPC ........................................................ 382/103

(58) Field of Classification Search
CPC ................................ G03F 7/70791; G03F 9/00
USPC ........................................................ 382/103
See application file for complete search history.

(56) References Cited

U.S. PATENT DOCUMENTS

| 4,393,387 A | 7/1983 | Kitamura |
| 4,402,571 A | 9/1983 | Cowan et al. |
| 4,423,426 A | 12/1983 | Kitamura |
| 4,440,493 A | 4/1984 | Hiraga |
| 4,541,712 A | 9/1985 | Whitney |

(Continued)

FOREIGN PATENT DOCUMENTS

| CN | 101329514 | 12/2008 |
| CN | 101405837 | 4/2009 |

(Continued)

OTHER PUBLICATIONS

Boisset, Buillaume, Calculation results from luxpop.com regarding thin film and index of refraction, www.luxpop.com. Accessed Jan. 31, 2008, (2 pages).

(Continued)

Primary Examiner — Tom Y Lu
(74) Attorney, Agent, or Firm — Lipsitz & McAllister, LLC

(57) ABSTRACT

A processing system for plate-like objects is provided, with an exposure device and an object carrier with an object carrier surface for receiving the object. The exposure device and the carrier are movable relative to one another, such that the exact position of the object relative to the carrier is determinable. An edge detection device is provided which comprises at least one edge illumination unit having an illumination area, within which an object edge located in the respective object edge area has light directed onto it from the side of the carrier. At least one edge image detection unit is provided on a side of the object located opposite the carrier, the edge image detection unit imaging an edge section of the object edges located in the illumination area as an edge image, such that the respective edge image is detectable in its exact position relative to the carrier.

15 Claims, 15 Drawing Sheets

(56) References Cited

U.S. PATENT DOCUMENTS

| | | |
|---|---|---|
| 4,577,926 A | 3/1986 | Dewey et al. |
| 4,755,724 A | 7/1988 | Wagner |
| 4,869,999 A | 9/1989 | Fukuda et al. |
| 4,947,186 A | 8/1990 | Calloway et al. |
| 5,091,744 A | 2/1992 | Omata |
| 5,121,256 A | 6/1992 | Corle et al. |
| 5,143,577 A | 9/1992 | Haas et al. |
| 5,208,796 A | 5/1993 | Wong et al. |
| 5,223,693 A | 6/1993 | Zumoto et al. |
| 5,274,396 A | 12/1993 | Shimoda et al. |
| 5,321,718 A | 6/1994 | Waarts et al. |
| 5,339,737 A | 8/1994 | Lewis et al. |
| 5,343,271 A | 8/1994 | Morishige |
| 5,418,546 A | 5/1995 | Nakagakiuchi et al. |
| 5,475,416 A | 12/1995 | Kessler et al. |
| 5,513,196 A | 4/1996 | Bischel et al. |
| 5,534,950 A | 7/1996 | Hargis et al. |
| 5,561,495 A | 10/1996 | Ishikawa et al. |
| 5,565,742 A | 10/1996 | Shichao et al. |
| 5,579,240 A | 11/1996 | Buus |
| 5,596,339 A | 1/1997 | Furness, III et al. |
| 5,614,961 A | 3/1997 | Gibeau et al. |
| 5,654,817 A | 8/1997 | De Loor |
| 5,674,414 A | 10/1997 | Schweizer |
| 5,739,913 A | 4/1998 | Wallace |
| 5,874,929 A | 2/1999 | Opower et al. |
| 5,892,611 A | 4/1999 | Iizuka |
| 5,936,713 A | 8/1999 | Paufler et al. |
| 6,002,466 A | 12/1999 | Brauch et al. |
| 6,025,864 A | 2/2000 | Nashimoto |
| 6,204,875 B1 | 3/2001 | De Loor et al. |
| 6,225,012 B1 | 5/2001 | Nishi et al. |
| 6,274,288 B1 | 8/2001 | Kewitsch et al. |
| 6,324,250 B1 | 11/2001 | Amemiya et al. |
| 6,368,775 B1 | 4/2002 | Potter, Jr. et al. |
| 6,489,626 B2 | 12/2002 | van der Muehlen et al. |
| 6,586,169 B2 | 7/2003 | Brauch et al. |
| 6,692,894 B1 | 2/2004 | Nakano et al. |
| 6,859,261 B2 | 2/2005 | Opower et al. |
| 7,126,735 B1 | 10/2006 | Kinoshita et al. |
| 7,310,463 B2 | 12/2007 | Shimotsuma et al. |
| 7,363,856 B1 | 4/2008 | Moulin |
| 7,372,478 B2 | 5/2008 | Oshida et al. |
| 7,388,663 B2 | 6/2008 | Gui |
| 7,652,750 B2 | 1/2010 | Opower et al. |
| 7,705,967 B2 | 4/2010 | Opower et al. |
| 2001/0016293 A1 | 8/2001 | Nishi et al. |
| 2001/0021484 A1 | 9/2001 | Brauch et al. |
| 2002/0015088 A1 | 2/2002 | Inoue et al. |
| 2002/0113218 A1 | 8/2002 | Okumura et al. |
| 2002/0114567 A1 | 8/2002 | Novotny et al. |
| 2002/0141024 A1 | 10/2002 | Retschke et al. |
| 2003/0031365 A1 | 2/2003 | Okuyama |
| 2003/0160948 A1 | 8/2003 | Opower et al. |
| 2003/0162124 A1 | 8/2003 | Akiba et al. |
| 2004/0165056 A1 | 8/2004 | Allen et al. |
| 2004/0240813 A1 | 12/2004 | Koyagi |
| 2004/0241340 A1 | 12/2004 | Sato et al. |
| 2005/0180692 A1 | 8/2005 | Ishikawa et al. |
| 2005/0219496 A1 | 10/2005 | Oshida et al. |
| 2006/0092419 A1 | 5/2006 | Gui |
| 2006/0170893 A1 | 8/2006 | Opower et al. |
| 2006/0244943 A1 | 11/2006 | Opower et al. |
| 2007/0236695 A1 | 10/2007 | Sjostrom |
| 2008/0094604 A1 | 4/2008 | Shibazaki |
| 2008/0213705 A1 | 9/2008 | Oshida et al. |
| 2009/0296063 A1 | 12/2009 | Opower |
| 2010/0030347 A1 | 2/2010 | Shindo |

FOREIGN PATENT DOCUMENTS

| | | |
|---|---|---|
| DE | 25 58 788 | 7/1976 |
| DE | 31 18 802 | 2/1982 |
| DE | 36 24 163 | 1/1987 |
| DE | 41 06 423 | 10/1991 |
| DE | 40 22 732 | 2/1992 |
| DE | 43 13 111 | 10/1994 |
| DE | 44 26 107 | 2/1995 |
| DE | 195 21 390 | 2/1996 |
| DE | 195 34 165 | 5/1996 |
| DE | 195 22 936 | 1/1997 |
| DE | 195 29 656 | 2/1997 |
| DE | 693 27 425 | 6/2000 |
| DE | 695 19 221 | 6/2001 |
| DE | 103 46 201 | 4/2005 |
| DE | 10 2005 011 339 | 10/2005 |
| DE | 10 2006 008 075 | 10/2006 |
| EP | 0 467 076 | 1/1992 |
| EP | 0 573 375 | 12/1993 |
| EP | 0 587 228 | 3/1994 |
| EP | 0 655 707 | 5/1995 |
| EP | 0 683 595 | 11/1995 |
| EP | 0 729 265 | 8/1996 |
| EP | 1 319 984 | 1/2003 |
| EP | 1 653 288 | 5/2006 |
| GB | 1 538 233 | 1/1979 |
| JP | 58033753 | 2/1983 |
| JP | 35 29 571 | 2/1987 |
| JP | 01221604 | 9/1989 |
| JP | 4025290 | 1/1992 |
| JP | 07288276 | 10/1995 |
| JP | 09186061 | 7/1997 |
| JP | 2002280287 | 9/2002 |
| JP | 2002184665 | 6/2006 |
| JP | 2006294954 | 10/2006 |
| JP | 2008040394 | 2/2008 |
| WO | 93/24326 | 12/1993 |
| WO | 98/00760 | 1/1998 |
| WO | 00/72092 | 11/2000 |
| WO | 2008/029609 | 3/2008 |
| WO | 2008/071347 | 6/2008 |

OTHER PUBLICATIONS

Kewitsch, Anthony S. and Yariv, Amnon (Jan. 22, 1996). "Nonlinear optical properties of photoresists for projection lithography." Applied Physics Letters, 68 (4). pp. 455-457.

Rostami et al., "A Proposal for High Resolution Photolithography Using Optical Limiters", Laser Phys. Lett. 1, No. 9, pp. 462-467, 2004.

*Patent Abstracts of Japan*, vol. 2000, No. 20, Publication No. 2001066783, Material for Forming Fine Pattern, and Fine Pattern Forming Method Using the Same, U.S. Appl. No. 11/242,778, Mar. 16, 2001.

Misawa, et al, "Microfabrication by Femtosecond Laser Irradiation", Proceedings of SPIE, vol. 3933, pp. 246-260 (2000).

*Patent Abstracts of Japan*, Publication No. 2001319382, "Exposure Device of Master Disk for Optical Recording Medium, Exposure Method of Master Disk for Optical Recording Medium, Optical Pickup and Optical Recording Method", application No. 2000134815, Nov. 16, 2001.

Patent Abstracts of Japan, Publication No. 56150826, Supporting Mechanism of Wafer, application No. 55054140, Nov. 21, 1981.

Patent Abstracts of Japan, Publication No. 08146326, Image Forming Device, application No. 06280897, Jun. 7, 1996.

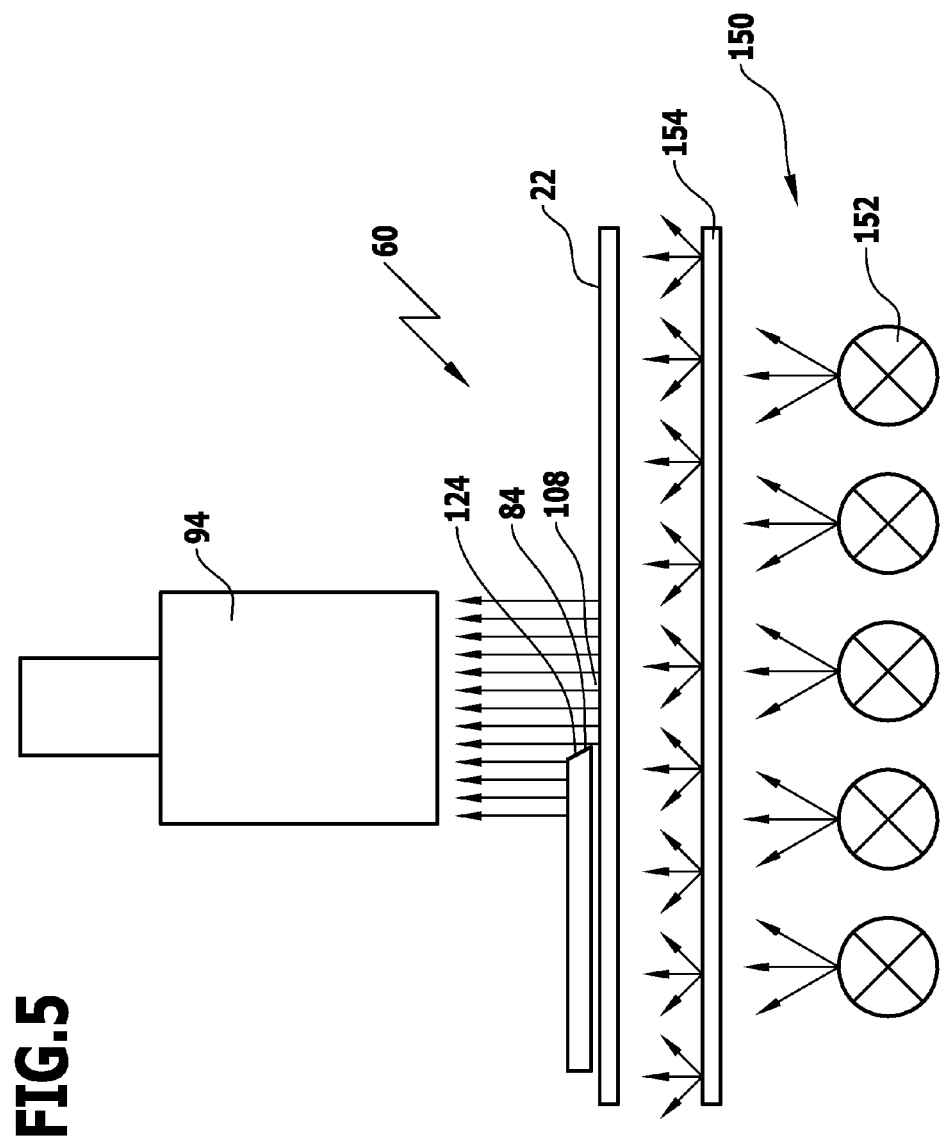

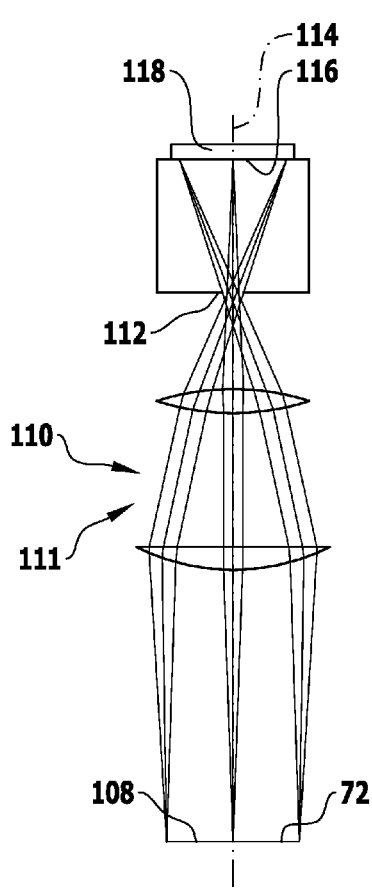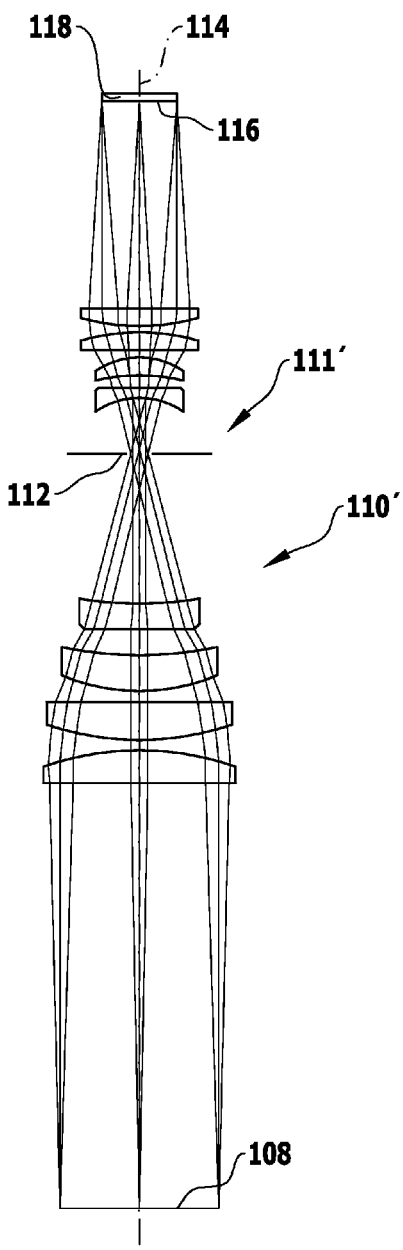

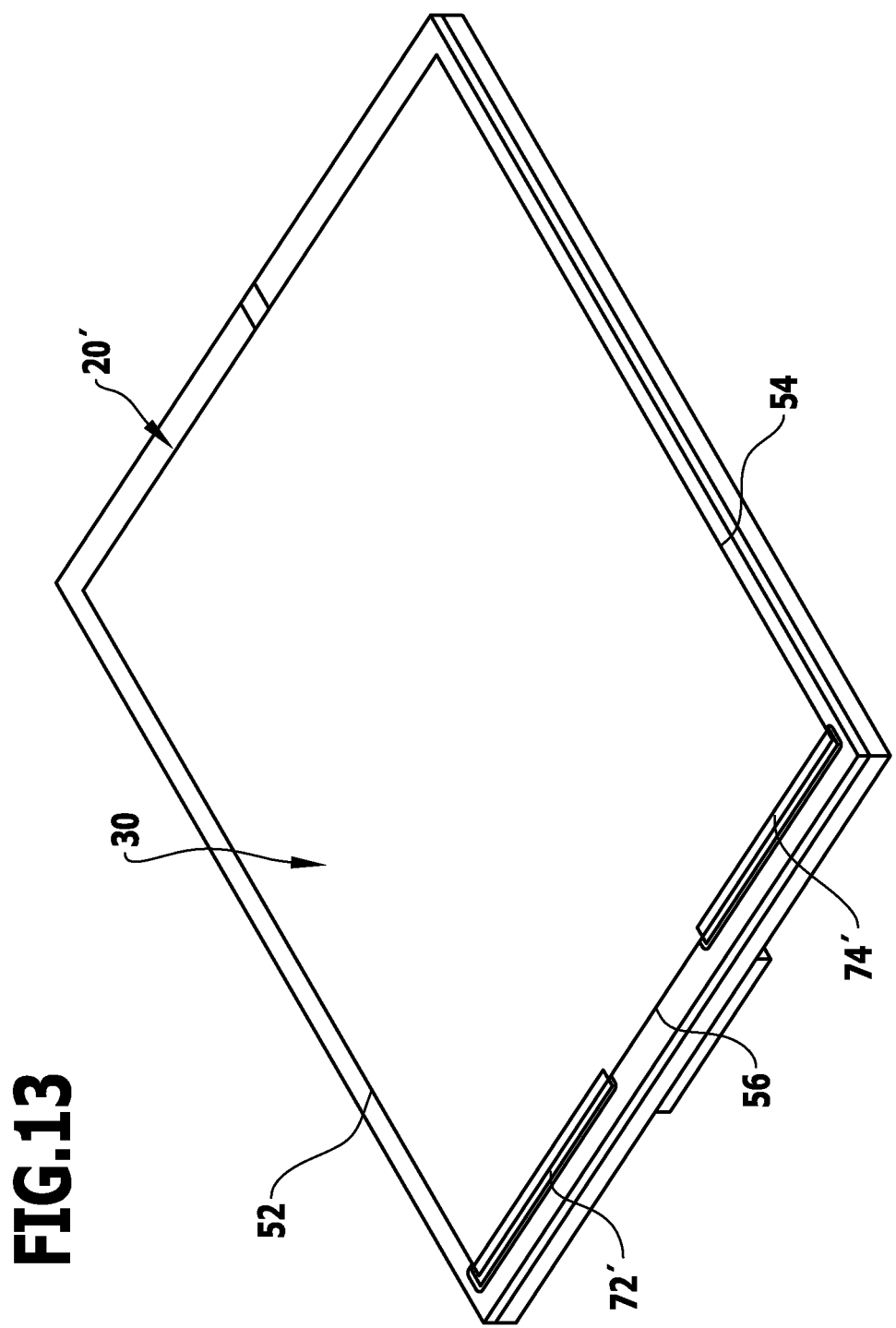

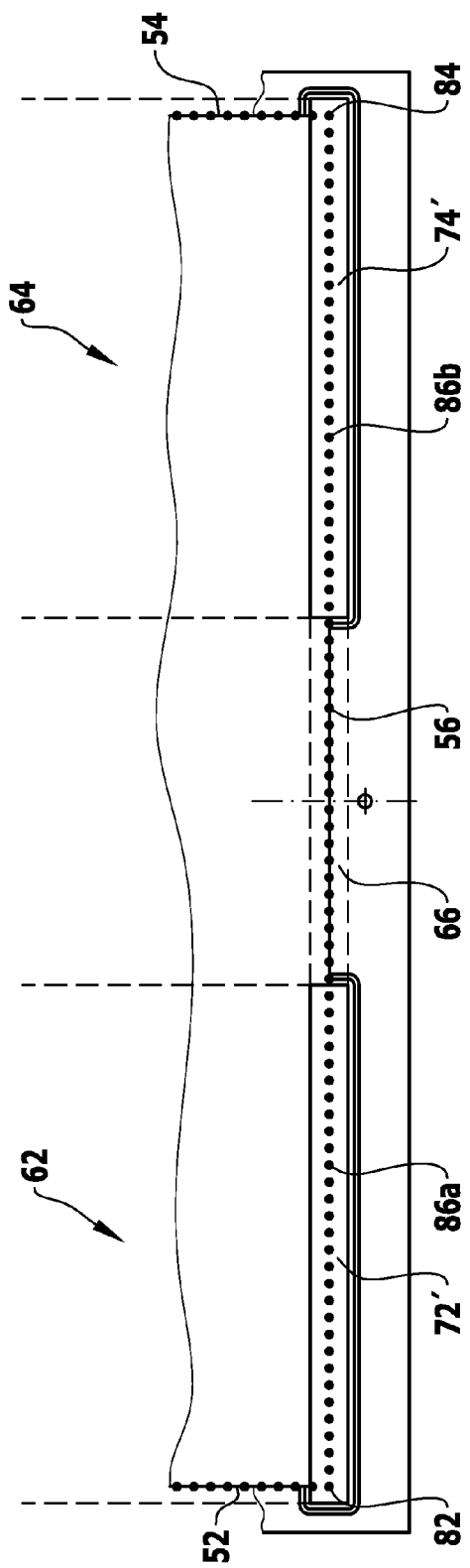

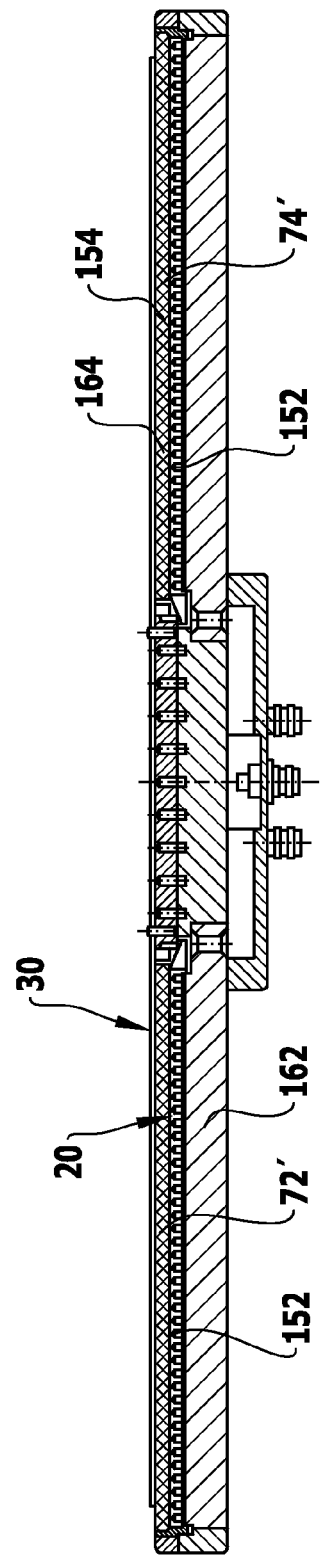

PROCESSING SYSTEM

This application is a continuation of International application number PCT/EP2010/059284 filed on Jun. 30, 2010.

This patent application claims the benefit of International application No. PCT/EP2010/059284 of Jun. 30, 2010 and German application No. 10 2009 032 210.8 of Jul. 3, 2009, the teachings and disclosure of which are hereby incorporated in their entirety by reference thereto.

BACKGROUND OF THE INVENTION

The invention relates to a processing system for plate-like objects, in particular an exposure system for plate-like objects, comprising an exposure device and an object carrier with an object carrier surface for receiving the object, wherein the exposure device and the object carrier are movable relative to one another for the purpose of exposing the object.

Processing systems of this type are known.

Such a processing system could be used, for example, for the laser treatment of plate-like objects.

It is, however, also conceivable to use such a processing system as exposure system for plate-like objects, in particular for plate-like objects with a photosensitive coating, wherein structures can be generated in the photosensitive coating by way of lithography.

The problem with such processing systems is that when the plate-like objects are intended to be placed on the object carrier or processed on both sides, in particular exposed, the object has to be positioned on the object carrier in a defined manner each time.

The object underlying the invention is, therefore, to improve a processing system of the generic type in such manner that the position of the plate-like object relative to the object carrier can be determined exactly.

SUMMARY OF THE INVENTION

This object is accomplished in accordance with the invention, in a processing system of the type described at the outset, in that an edge detection device is provided for the purpose of detecting the position of the object on the object carrier and comprises at least one edge illumination unit arranged in the object carrier beneath the object carrier surface, that the edge illumination unit has an illumination area in at least one section of an object edge area and within said illumination area an object edge located in the respective object edge area has light which is radiated areally directed onto it from the side of the object carrier, and that at least one edge image detection unit is provided at a distance from the object carrier surface on a side of the object located opposite the object carrier and images an edge section of one of the object edges located in the illumination area onto an image surface as edge image and that the respective edge image can be detected in its exact position relative to the object carrier with the at least one edge image detection unit.

The advantage of the solution according to the invention is to be seen in the fact that with this solution it is possible in a simple manner to detect the position of the object edges on the object carrier exactly and, therefore, to align the structures generated on the object exactly relative to the object edges.

This is advantageous, for example, in the case of complex structures, wherein the structure on one surface of the object must match the structure on the other surface of the object in order to be able, for example, to link the structures to one another.

The precision of the detection of the object edges may be improved, in particular, in that the optical device of the at least one edge image detection unit is designed as a telecentric lens.

Such a telecentric lens has the advantage that it images onto the image surface only beams which extend parallel to the optical axis of such a lens and so, as a result, an exact silhouette of the respective object edge can be imaged onto the image surface.

In order to avoid faulty edge images as a result of edge surfaces which extend at an angle, it is preferably provided for an optical axis of the telecentric lens to deviate at the most by 5° from a line which is vertical relative to the object carrier surface.

As a result, the edge image on the image surface is imaged by beams which all extend essentially in a vertical direction relative to the object carrier surface and so even an inclined edge surface of an object edge always supplies the same silhouette.

The image surface of the edge image detection unit could, for example, be an image surface, in which an operator of the processing system can recognize the position of the object edge in the edge image immediately with his eyes or with an optical device.

One particularly favorable solution provides, however, for the image surface to be the image surface of an image sensor, by means of which the edge image may be detected.

Such a sensor could be any type of optical sensor.

In order to be able to determine the position of the object edge exactly, it is favorable when the image sensor is a camera image sensor so that the position of the object edge can be detected on the camera image sensor with the resolution thereof.

In principle, the edge image detection unit could be designed such that it detects the associated illumination area completely.

Such a design of the edge detection area would, however, require a correspondingly complicated optical device.

In order to be able to construct the edge image detection unit with as simple means as possible, it is preferably provided for the optical device of the at least one edge image detection unit to have a detection area which has a smaller surface extension than the respective illumination area.

As a result, it is possible to use an inexpensive optical device.

In principle, when the position of the respective object edge is determined approximately and the blurring of the positioning of the respective object edge is located within the detection area, the edge image detection unit can be positioned stationarily relative to the illumination area.

However, in order to be able to operate with large differences with respect to the position of the object edges for as long as they are located in the respective illumination area, it is preferably provided for the detection area and the illumination areas to be movable relative to one another. As a result, it is possible to detect the entire illumination area with the detection area, but successively, in a simple manner by way of the relative movement of detection area and illumination area.

In this respect, it is provided, in particular, for the detection area to be movable at least to such an extent until the object edge is located in the detection area.

One particularly favorable solution provides for the detection area to be movable in a direction transverse to the respective object edge to be detected.

Alternatively thereto, one favorable solution provides for the detection area to be movable in the direction of the respective object edge to be detected.

Movement of the detection area could be brought about, in principle, by way of optical deflection elements but these would have the disadvantage that, as a result, blurring would occur in the area of the detection of the object edges.

For this reason, one advantageous solution provides for the at least one edge image detection unit and the object carrier to be movable relative to one another in at least one direction.

In addition, in order to open up the possibility of detecting object edges in several illumination areas with one edge image detection unit, it is preferably provided for the at least one edge image detection unit and the object carrier to be movable relative to one another in two directions which extend transversely to one another.

With respect to the illumination areas provided, no further details have been given in conjunction with the preceding explanations concerning the individual embodiments.

With one solution it would be conceivable to provide a very large illumination area, in which several object edges can be detected.

In order to configure the detection of the object edges as simply as possible, it is preferably provided for the object carrier to have an illumination area for each object edge for directing light onto this object edge.

As a result, each object edge is preferably provided with an illumination area created specifically for it.

Alternatively thereto, another advantageous solution provides for several, for example, two object edges to have light directed onto them and be monitored in one illumination area so that, as a result, the number of illumination areas can be reduced and the detection of the object edges can be brought about more quickly.

The number of illumination areas can vary with a view to the number of object edges to be detected.

In order to ascertain the position of the object relative to the object carrier it could be sufficient to detect two object edges and, in particular, to detect the course of the two object edges relative to the object carrier.

In the case of as precise a detection as possible of the position of the object relative to the object carrier, it is, however, advantageously provided for three object edges of the object to be detected with the processing system according to the invention.

Particularly when three object edges are detected, it would, in theory, be sufficient to detect one point in the region of each object edge.

The accuracy of the edge detection unit according to the invention may, however, be enhanced considerably when the at least one edge image detection unit records at least one edge section of the object with the respective edge image.

This means that the respective edge image does not detect and record merely one point of the object edge but rather an entire edge section, i.e. a plurality of points along an object edge.

In this respect, it is favorable, in particular, when the at least one edge image detection unit records a course of an edge section of the object with the respective edge image.

This means that all the image points located along the edge section can be detected and so it is possible to subsequently recognize this edge section again on account of its particular course, i.e., for example, on account of its course not extending in a straight line and, therefore, use this for the exact positioning or for the exact measurement of the position of the object relative to the object carrier.

Such a course of an edge section therefore results not only in information on the position of the edge section in one spatial direction but rather in two spatial directions, i.e. in a plane.

Particularly when the courses of several edge sections of several object edges are detected, it is possible to improve the precision of the detection of the position of the object relative to the object carrier considerably, as a result, since a two-dimensional detection of the course of an edge section is possible with each course of the edge section.

One particularly favorable solution provides for the stored course of the edge section to be used for recognizing this edge section again once the object has been placed in position again and for the precise detection of the position of the object.

Such a solution has the great advantage that when the same object is again placed on the object carrier, either after turning the object over or after temporarily removing it and placing it in position again in the same orientation, the position of this object relative to the object carrier can be detected even more exactly as a result of the edge section being recognized again and so the relative positional accuracy can be improved even further, in particular in the case where the same objects are placed back on the object carrier, as a result of this re-recognition of the edge sections on account of the two-dimensional course which can be detected in the case of several edge sections and, therefore, on account of overdetermined position information for the object.

With respect to the design of the illumination unit, no further details have so far been given.

In principle, at least one light source is sufficient to emit the areal light.

The light emitted preferably has a wavelength which is in the red or close infrared spectral range in order not to trigger any photochemical processes in the photosensitive layer.

One advantageous solution provides for the illumination unit to have a diffuser and at least one light source directing light onto it for the purpose of illuminating the respective illumination area.

Such a diffuser having light directed onto it by light sources has the great advantage that, as a result, a very even intensity and, in particular, a diffuse radiation is available which makes the recognition of the object edge or the edge section in the edge image easier, in particular in an automatic manner, since the gradient between the part of the detection area not covered by the object and the covered part of the detection area is essentially always the same irrespective of the position of the object edge in the illumination area and the radiation detected by the edge image detection unit has essentially the same intensity irrespective of the location of the illumination area, in particular also on account of the diffuse radiation.

One particularly simple way of integrating the illumination unit into the object carrier provides for the light sources and the diffuser to be integrated into the object carrier.

With respect to the design of the object carrier, no further details have so far been given.

One advantageous solution, for example, provides for the object carrier to have an object carrier plate forming the object carrier surface and for the light from the illumination unit to pass through the object carrier plate.

As a result, it is possible to provide a continuous object carrier surface, on which to place the object, which is not affected by the illumination unit and so no inaccuracies with respect to the positioning of the object on the object carrier surface occur as a result of the illumination unit itself.

In this respect, the diffuser could be arranged beneath the object carrier plate.

It is, however, particularly favorable when the object carrier plate acts as an optical diffuser, i.e. represents the optical diffuser in addition to receiving the object.

In this respect, it is particularly favorable when the light sources illuminating the diffuser are arranged in a base member bearing the object carrier plate, are, in particular, integrated in this base member so that, as a result, no additional attachments on the object carrier are required.

Additional features and advantages of the invention are the subject matter of the following description as well as the drawings illustrating one embodiment.

BRIEF DESCRIPTION OF THE DRAWINGS

FIG. 5 shows an illustration similar to FIG. 4 of an edge detection of the object edge located opposite;

FIG. 6 shows a schematic illustration of an optical device of an edge image detection unit according to the invention;

FIG. 12 shows a schematic illustration of an optical device of an edge image detection unit according to the invention similar to FIG. 6 in a third embodiment according to the invention;

FIG. 13 shows a perspective illustration of an arrangement of an object 30 on an object carrier 20" and ascertainment of the positions of the object edges in a fourth embodiment;

FIG. 14 shows an enlarged illustration of a section in a plan view similar to FIG. 3 of the fourth embodiment with dotted object edges;

FIG. 15 shows a section along line 15-15 in FIG. 14;

DETAILED DESCRIPTION OF THE INVENTION

Figure 1:
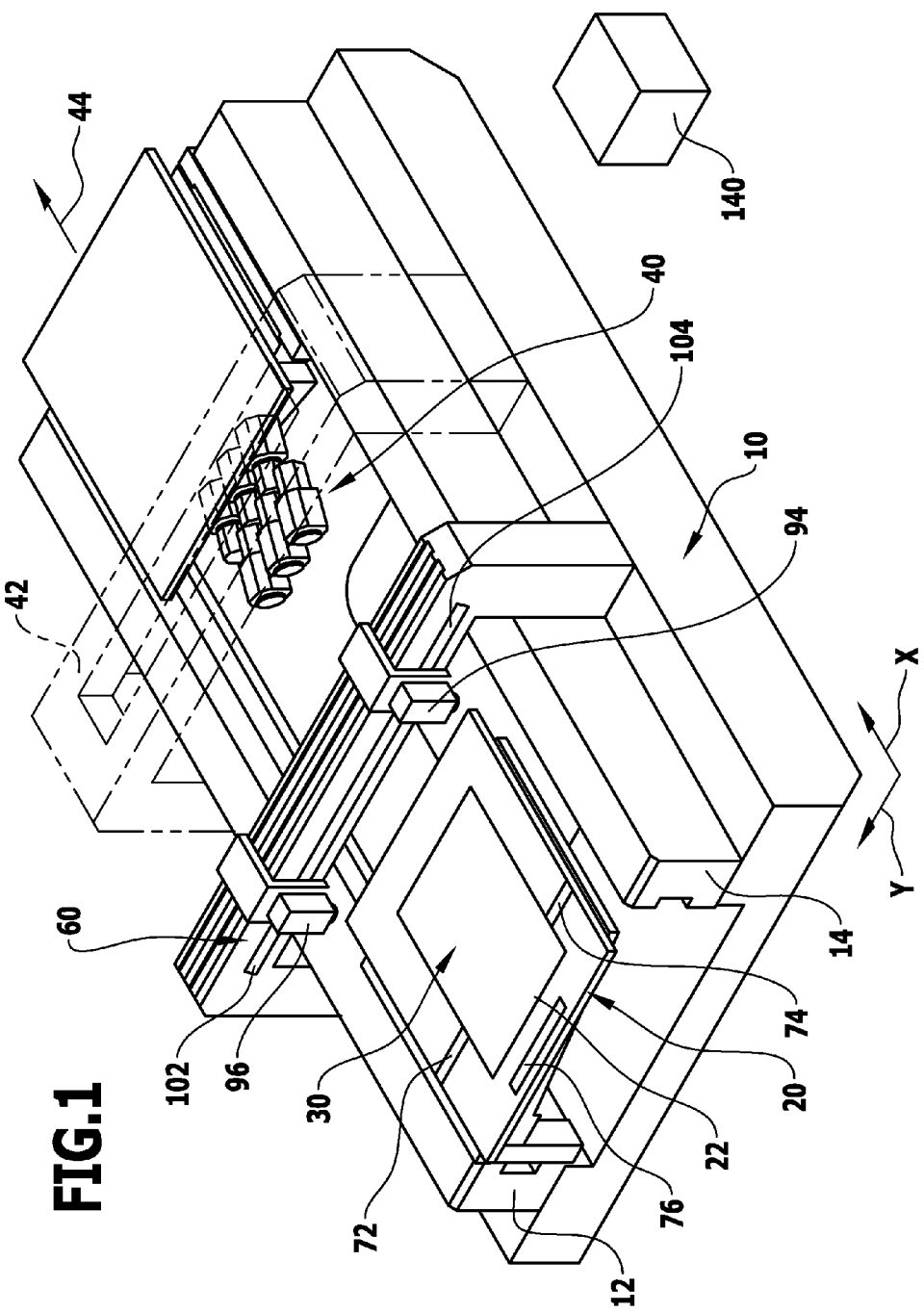
FIG. 1 shows a schematic perspective overall view of a processing system according to the invention.

A first embodiment of an exposure device according to the invention, illustrated in FIG. 1, comprises a machine frame which is designated as a whole as 10 and has two longitudinal guides 12, 14 which are arranged at a distance from one another and on which an object carrier designated as a whole as 20 is guided for movement in a first direction designated, for example, as X direction.

Figure 2:
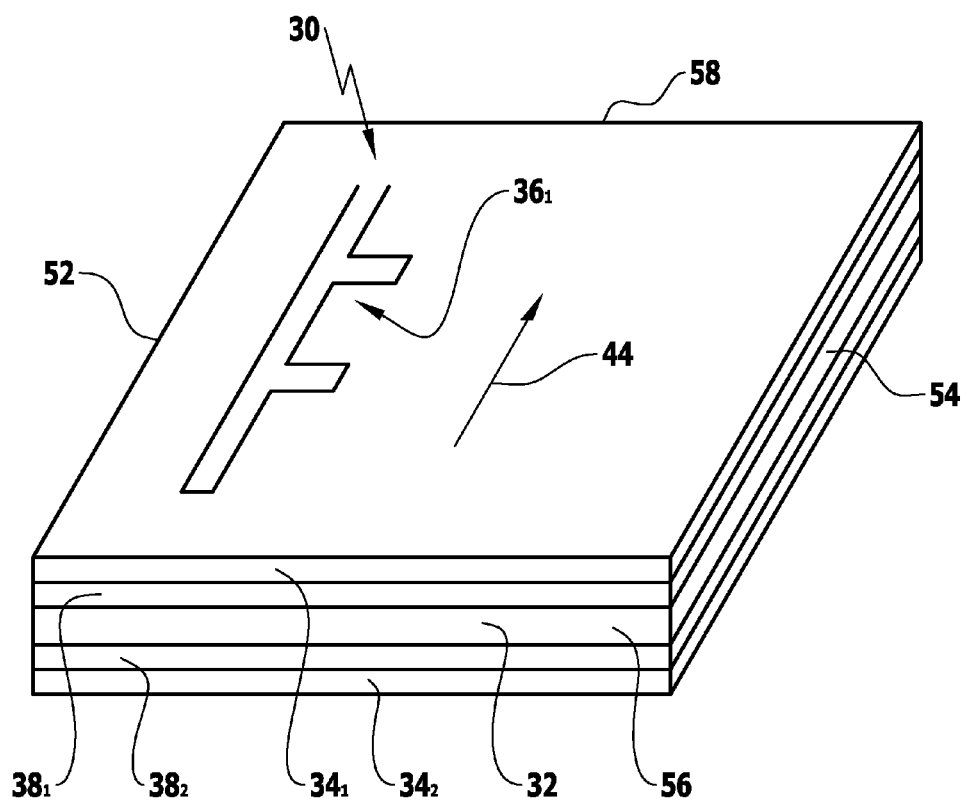
FIG. 2 shows a perspective illustration of an object to be processed in a processing system according to the invention.

The object carrier 20 has an object carrier surface 22, on which objects 30 can be placed which comprise, for example, as illustrated in FIG. 2, a substrate 32 which is coated on both sides with photosensitive layers $34_1$ and $34_2$, wherein structures 36 can be generated in the photosensitive layers $34_1$ and $34_2$ by way of photochemical conversion of the respective photosensitive layer 34.

These structures 36 are, for example, structures which cover a copper layer $38_1$ and $38_2$ on the substrate 32 and so the copper layer $38_1$ and $38_2$ on the substrate 32 can be removed, for example, subsequently within the scope of an etching process at those points, at which it is not covered by the structures 36, while the copper layer remains only in those areas, in which it is covered by the structures 36.

The production of the structures 36 in the photosensitive layer 34 is brought about by an exposure device which is designated as a whole as 40 in FIG. 1 and is arranged on a bridge 42 which is seated, for its part, on the machine frame 10, wherein any relative movement between the exposure device 40 and the object 30 is brought about in that the object carrier 20 at least can be moved in the X direction relative to the exposure device 40 and so the X direction represents a direction of feed 44 during the exposure of the object 30 and, where applicable, the exposure device 40 is held on the bridge 42 so as to be movable in a Y direction, as well.

Such an exposure device is described, for example, in WO 2008/071347 A, to which reference is made in full with respect to its description.

If the object 30, as illustrated in FIG. 2, comprises a substrate 32 which is coated on both sides with a photosensitive layer 34, it is necessary to turn the object 30 after exposure of one of the photosensitive layers, for example exposure of the photosensitive layer $34_1$, in order to expose the photosensitive layer on the opposite side, for example the photosensitive layer $34_2$.

In this case, it is, however, necessary to ensure that the structures $36_1$ of the photosensitive layer $34_1$ and the structures 36 exposed in the photosensitive layer $34_2$ match exactly in order to avoid any offset.

It is, therefore, necessary to detect the position of the substrate 30 on the object carrier 20 exactly in order to position the structures 36 in exact alignment in relation to the respective object edges 52, 54 and 56, 58 of the object 30.

Normally, the respective object edges 52, 54 and 56, 58 run parallel to one another but deviations from an axial parallelism can, however, also occur and deviation from an exactly straight-lined course of the object edges 52, 54 and 56, 58 can occur.

Figure 3:
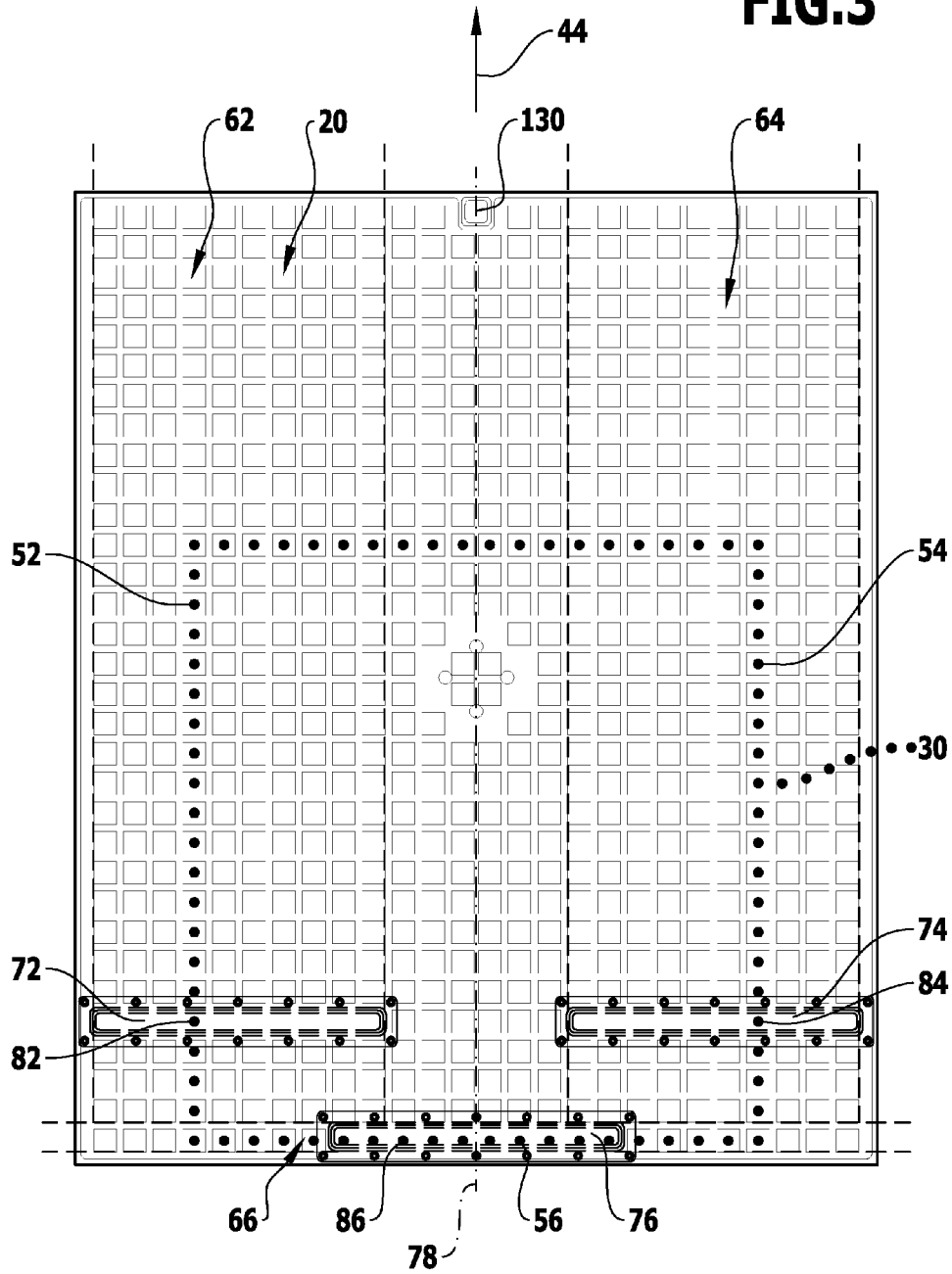
FIG. 3 shows a plan view of an object carrier surface of an object carrier of a processing system according to the invention.

In order to be able to detect the object edges 52, 54, 56, 58 on the object carrier 20, object edge areas 62, 64, 66, within which the object edges 52, 54 and 56 of the objects 30 are located when they are of normal sizes, are defined on the object carrier 20, as illustrated in FIG. 3, and an edge detection device 60 is provided.

In this respect, the object edge area 66 is selected such that the same object edge 56, which runs transversely to the direction of feed 44, is always located in it, irrespective of whether the photosensitive layer $34_1$ or $34_2$ is intended to be exposed.

This means that the object edge area 66 covers the object edge 56 of the object 30, which extends transversely to the direction of feed 44, in both positions.

The object edge areas 62 and 64 are selected such that the object edges 52 and 54, respectively, which extend parallel or at an angle to the direction of feed 44, are located in them, wherein in the one position the object edge 52 is located in the object edge area 62 and the object edge 54 in the object edge area 64 and in the position turned through 180° the object edge 54 is located in the object edge area 62 and the object edge 52 in the object edge area 64.

The detection of the object edges 56 or 52 and 54 in the object edge area 66 or 62 and 64, respectively, is brought about optically, namely, on the one hand, by way of illumination areas 76, 72 and 74 which are provided in the object carrier 20 and extend over at least part of the respective object edge areas.

For example, the illumination area 76 is located symmetrically to a central axis 78 of the object carrier 20 which extends parallel to the direction of feed 44 and intersects it while the illumination areas 72 and 74 likewise extend transversely to the central axis 78 but at a distance from it and, in addition, are arranged at a distance from the illumination area 76 in the direction of the central axis 78.

The distance of the illumination areas 72 and 74 from the illumination area 76 depends on the minimum extension of the possible objects 30 in the direction of the central axis 76 and is preferably slightly shorter than the minimum extension of the possible objects 30 in the direction of the central axis 78 proceeding from the object edge area 66.

The illumination areas 76, 72 and 74 are partially covered by the object 30 which is located on the object carrier 20 and illustrated by dotted lines in FIG. 3 and so the object 30 intersects the illumination area 76 with its object edge 56 and the illuminations areas 72 and 74 with its object edges 52 and 54 and, consequently, the object edge 56 is backlit by the illumination area 76 and the object edges 52 and 54 are backlit by the illumination areas 72 and 74 and so it is possible to take an edge image of the object edges 56 or 52 and 54 located in the illumination areas 76, 72 and 74, namely of the respective edge sections 86 or 82 and 84 which are located within the illumination areas 76 or 72 and 74.

Figure 4:
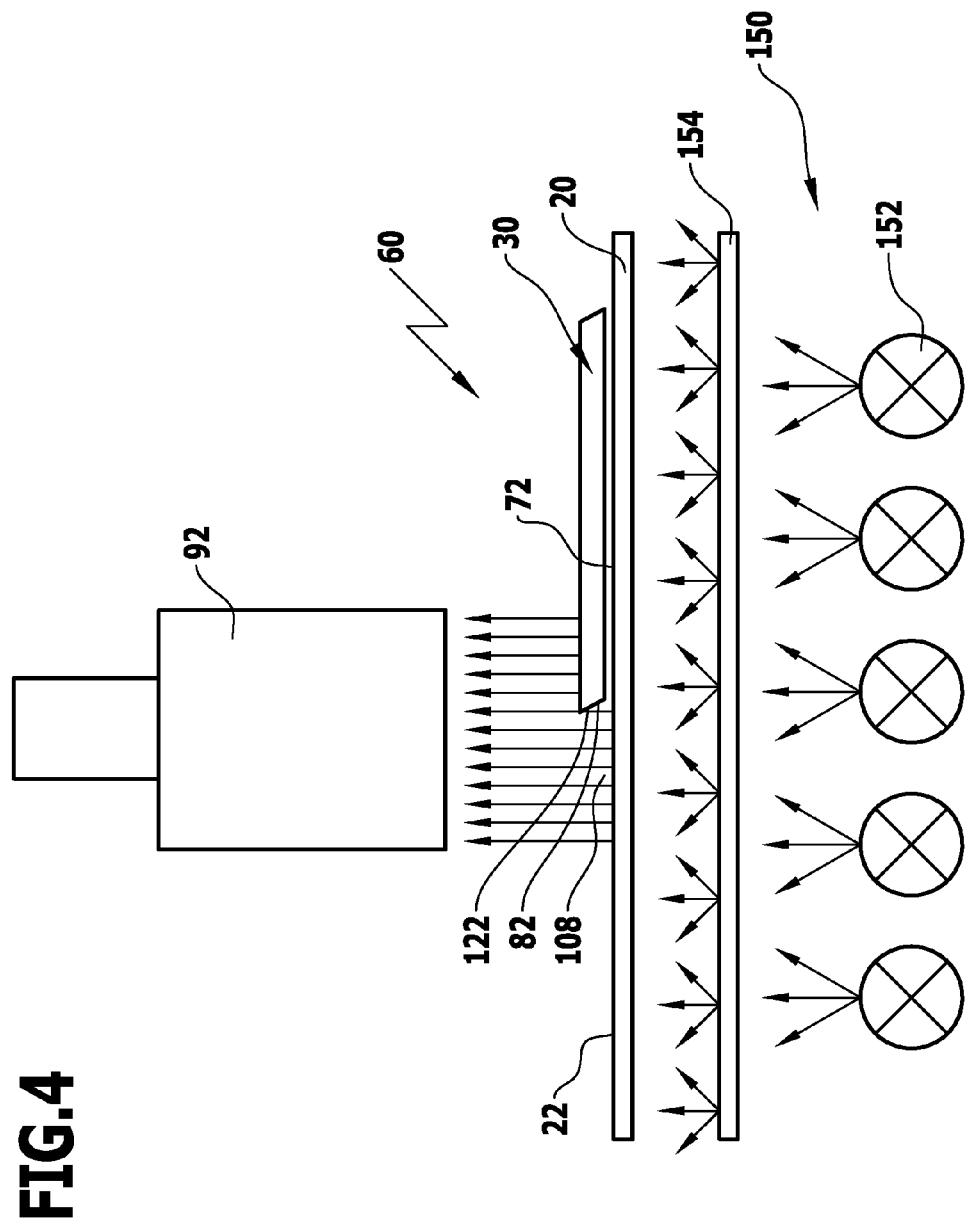
FIG. 4 shows a schematic sectional view of an object edge with an illumination unit according to the invention and an edge image detection unit according to the invention in a first embodiment of the processing system according to the invention.

Edge images are taken, as illustrated in FIGS. 4 and 5 by way of example on the basis of the edge sections 82 and 84, by edge image detection units 92 and 94 which are illustrated in FIGS. 4 and 5 and which, as illustrated in FIG. 1, are held, for example, on a bridge 96 which is seated on the machine frame 10 and are displaceable in a direction Y which extends transversely to the X direction, preferably at right angles to it, wherein the positions of the edge image detection units 92 and 94 relative to the bridge 96 can be detected each time by distance measuring systems 102 and 104.

As illustrated in FIG. 6, each of the edge image detection units 92, 94 comprises an optical device 110 with a telecentric lens 111 which, as a result of an aperture diaphragm, causes only beams which are parallel to an optical axis 114 to be imaged onto an image surface 116 of an image sensor 118 from a detection area 108 which is located in the respective illumination area, for example the illumination area 72.

The image sensor 118 is designed, for example, as a type of sensor such as that used in cameras.

Figure 7:
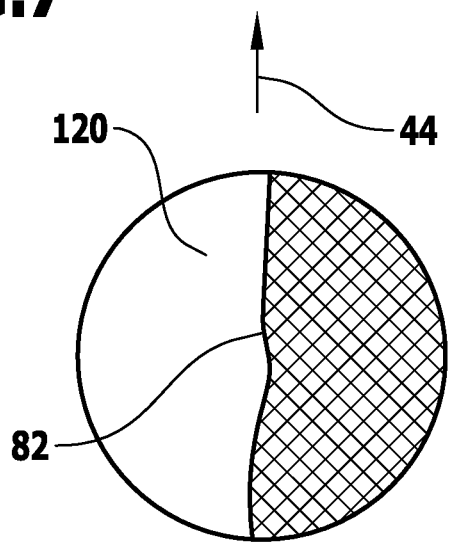
FIG. 7 shows a schematic illustration of an edge image during the edge image detection according to FIG. 4.

As a result, the edge image 120 which shows the edge section 82 in the case illustrated in FIG. 6, appears on the image surface 116, as illustrated in FIG. 7, namely not only the position thereof but also its course.

Figure 8:
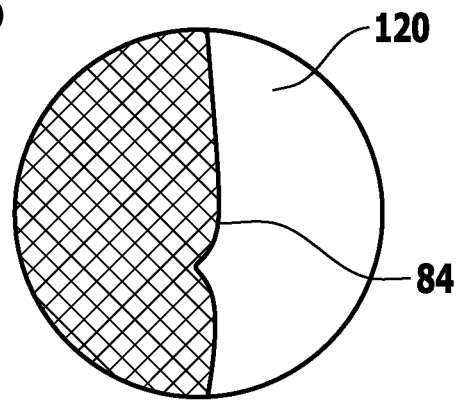
FIG. 8 shows a schematic illustration of the edge image during the edge image detection according to FIG. 5.

The edge image 120 of the edge section 84 which is illustrated in FIG. 8 can be generated in the same way with the edge image detection unit 94.

Figure 9:
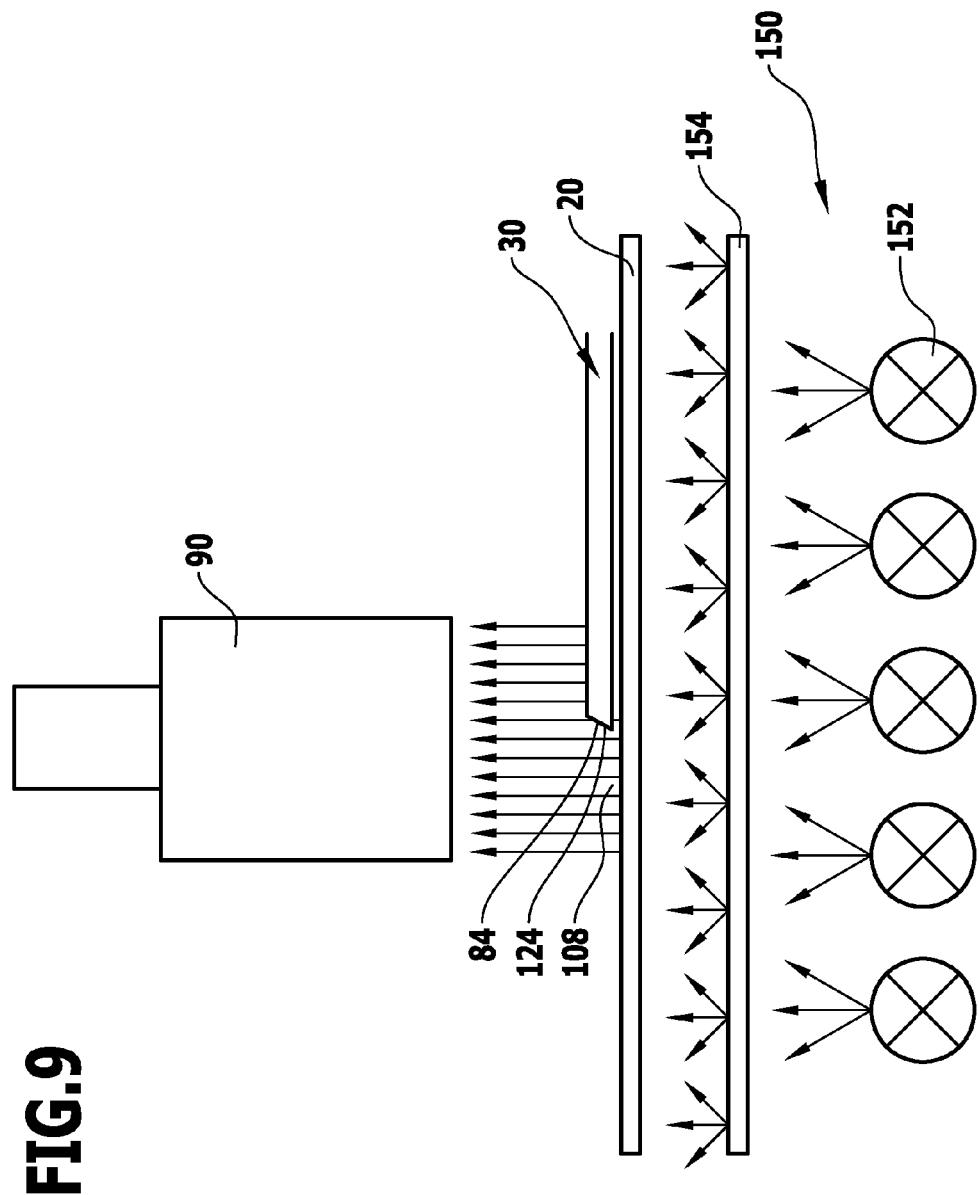
FIG. 9 shows a schematic illustration of the edge image detection according to FIG. 5 but with an object turned through 180°.
Figure 10:
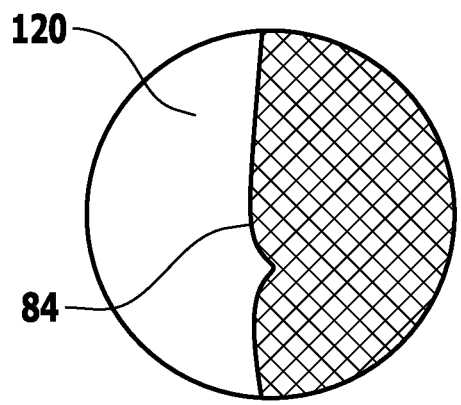
FIG. 10 shows a schematic illustration of the edge image during the edge image detection according to FIG. 9.

The optical axis 14 and, therefore, the radiation which is imaged onto the image surface 116 by the optical device 110 operating as a telecentric lens, runs at right angles to the object carrier surface 22 and so edge surfaces 122 and 124, respectively, which extend at an angle to the object carrier surface 22 do not result in any falsification since, when the object 30 is turned through 180°, the edge section 84 with the edge surface 124 results, as is shown by a comparison of FIGS. 5 and 9, in the same edge image 120 but turned through 180° without the edge surface 124, which extends at an angle to the object carrier surface 22, affecting the edge image obtained which is, however, turned through 180°, as illustrated in FIG. 10.

With the solution according to the invention, it is not the position of individual points of the respective edge section 82 or 84 which is determined in order to evaluate and determine the position of the object 30 on the object carrier 20 but rather the position of the entire edge image of the edge section 82 or 84 in the Y direction and by determining the position of the edge section 82 or 84 prior to turning the object 30 and after turning the object 30, the position of the object 30 on the object carrier 20 prior to turning and after turning may be determined exactly in Y direction.

In order to be able to take measurements of the positions of the edge sections 82 and 84 in the Y direction relative to the object carrier 20 which are as exact as possible, the object carrier 20 is also provided with a reference mark 130, to which each of the edge image detection units 92 and 94 can travel and the edges of which, which are likewise backlit, can be detected by the edge image detection units 92 and 94 in the same way as that described in conjunction with the edge sections 82 and 84.

The position of the edge section 86 can also be detected in the same way, wherein for this purpose one of the edge image detection units 92 and 94 or both edge image detection units 92 and 94 will be positioned over the illumination area 76 as a result of travel in Y direction in order to detect either the position of the entire edge section 86 or parts of the edge section 86 in X direction and produce edge images 120 for this.

The evaluation of the position of the edge sections 82, 84 and 86 is preferably brought about by a control 140 for the exposure device 40 which is in a position to determine the position and the course of the respective edge sections 82, 84, 86 in the respective directions X and Y from the edge images 120 and, on account of this position determination, to control the exposure of one $34_2$ of the photosensitive layers relative to the other one $34_1$ of the photosensitive layers in an exactly adjusted manner so that the structures to be generated in the two photosensitive layers $34_1$, $34_2$ are also positioned exactly relative to one another.

In order to obtain as even a brightness as possible in the respective illumination areas 76, 72, 74, edge illumination units 150 are provided, as illustrated in FIGS. 4 and 5 by way of example, and they have individual light sources 152 which are arranged in one or more rows next to one another and, in addition, a diffuser 154 is provided between the individual light sources 152 and this scatters the light from the rows of light sources 152 such that a diffuse and, therefore, largely even light with respect to its brightness is present on a side of the diffuser 154 facing the respective illumination area, for example, the illumination area 72, wherein in each point of the respective illumination area 72 the light is radiated in all directions, of which only the beam directions extending at right angles to the object carrier surface 22 are selected for the purpose of generating the respective edge image 120.

In this respect, the light sources 152 are preferably formed from semiconductor diodes which are arranged in one or several rows offset relative to one another in order to direct light onto the diffuser 154 in as uniform a manner as possible, as illustrated in FIG. 4, 5 or 9.

The light sources emit light, for example, in a wavelength in the red or close infrared spectral range in order to avoid any exposure of the photosensitive layers 34 which leads to a photochemical conversion in them.

The edge detection device 60 according to the invention therefore comprises one or more edge illumination units 150 which are preferably integrated in the object carrier 20 as well as the edge image detection units 90 and 92 which are held on the machine frame 10.

For the purpose of generating the edge images 120, the edge image detection units 92 and 94 as well as the edge illumination units 150 are, however, movable relative to one another in order to be able to detect the respective edge images of the object edges 52, 54, 56 and evaluate them.

In the embodiment illustrated, the edge image detection units 92 and 94 are guided on the bridge 96 for movement in the Y direction relative to the machine frame while the edge illumination units 150 are movable relative to the machine frame in the Y direction with the object carrier 20.

It is, however, possible in general to obtain a relative movement of the edge image detection units 94 and the edge illumination units 150 relative to one another in other ways in that either the edge image detection units 92, 94 or the edge illumination units 150 are movable in two directions extending transversely to one another.

The movement of the edge image detection units 92 and 94 and the edge illumination units 150 relative to one another is brought about in a manner controlled via the control 140, to which the position of the edge illumination units 150 in the object carrier 20 is specified, so that the control 140 is able to position the respective edge illumination units 150, which are associated with the illumination areas 76, 72 and 74, such that they can be detected by the edge image detection units 92, 94, wherein the respective illumination area 76, 72, 74 is imaged onto the respective image surface 116 of the image sensor 118.

As a result of the fact that the detection areas 108 have a smaller surface extension than the illumination areas 76, 72, 74, it is necessary to always move the edge image detection units 92, 94, controlled by the control 140, such that in each edge image 120 generated the respective edge section 82, 84, 86 to be measured is located approximately in the center of the edge image.

As a result of the relative position of the edge image detection unit 92, 94 and the respective illumination area 76, 72, 74 on the object carrier 20 specified to the control 140, the position of the respective edge section 82, 84, 86 in the respective edge image 120 can be evaluated exactly since a focused, bright-dark contrast is present at it.

As a result, the position of the object 30 on the object carrier 20 can be determined exactly by the edge detection device 60 according to the invention prior to any exposure of the respective photosensitive layer $34_1$ or $34_2$ and, therefore, the exposure of the respective photosensitive layer can be corrected exactly in accordance with the position of the object edges 52, 54, 56.

In order, in particular, to improve the precision of the detection of the position of the object 30 relative to the object carrier 20 when the object 30 is turned through 180° so that the flat side previously located on top now lies on the object carrier surface 22 and the flat side previously lying on the object carrier surface 22 now faces the exposure device 40, the edge images 120 can be stored in the control with the respective course of the edge sections 82, 84, 86 so that this edge section 82, 84, 86, after turning, can be found again on account of its course and can be brought into congruence with the course of the edge section detected prior to turning, which results in greater precision during the determination of the position of the object 30 after turning in relation to the position of the object 30 prior to turning, relative each time to the object carrier 20.

Figure 11:
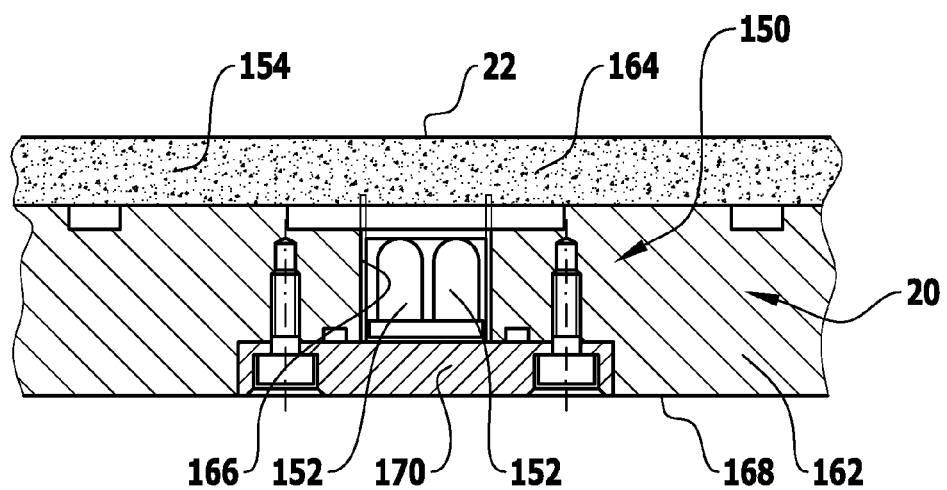
FIG. 11 shows a section through the object carrier in a second embodiment according to the invention.

In a second embodiment of a processing system according to the invention, the respective edge illumination unit 150 is, as illustrated in FIG. 11, integrated into the object carrier 20, wherein the object carrier 20 comprises a base member 162 and an object carrier plate 164 resting on the base member 162, wherein the object carrier plate 164 is designed, for example, as a ceramic plate which, for its part, forms the object carrier surface 22 on its side facing away from the base member 162.

The edge illumination unit 150 is, for example, integrated into the base member 162 such that the diffuser 154 is formed by the object carrier plate 164, which therefore acts, for its part, as an optical diffuser, and is seated on the base member 162 and has light directed onto it by the light sources 152 designed as light diodes from its side facing away from the object carrier surface 22, wherein the light sources 152 are formed, for example, by two or more rows of light diodes seated next to one another.

The light diodes 152 are thereby seated in a recess 166 in the base member 162 which penetrates the base member 162 as far as its underside 168, wherein the recess 166 is, however, closed by a cover plate 170 terminating with the underside 168.

As for the rest, reference is made in full to the comments on the first embodiment with respect to all the additional features of the second embodiment.

In a third embodiment, illustrated in FIG. 12, the optical device 110' comprises a telecentric lens 111' on both sides, with which the aperture opening 112 gives rise to beams parallel to the optical axis 114 both in the object space and in the image space, i.e. uses only these beams for the imaging and so in contrast to the first embodiment an improved telecentric behavior is present.

As for the rest, the third embodiment operates in the same way as the preceding embodiments and so reference is made in full to the preceding embodiments with respect to the remaining features.

In a fourth embodiment of an exposure system according to the invention, illustrated in FIGS. 13 to 15, the object edge areas 62 and 64 as well as 66 are arranged, as illustrated, for example, in FIG. 14 on an enlarged scale, such that they overlap within illumination areas 72' and 74' so that edge sections 82 and 86a of the object edges 52 and 56 can be detected by means of the illumination area 72' and edge sections 84 and 86b of the object edges 54 and 56 can be detected by means of the illumination area 74'.

The object edges 52, 54 and 56 are likewise detected by the edge image detection units 92 and 94 which are movable at least in the Y direction, preferably also in the X direction, in order to use the detection areas 108 located within the respective illumination areas 72' and 74' for detecting the edge images 120 of edge sections 82 and 84 as well as 86a and 86b.

Figure 16:
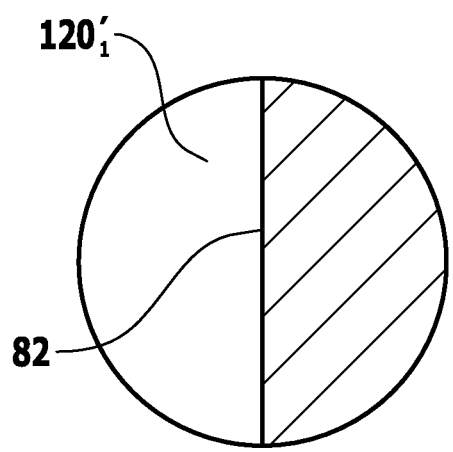
FIG. 16 shows an illustration of an edge image of an edge section of a lateral edge of the object similar to FIG. 7.
Figure 17:
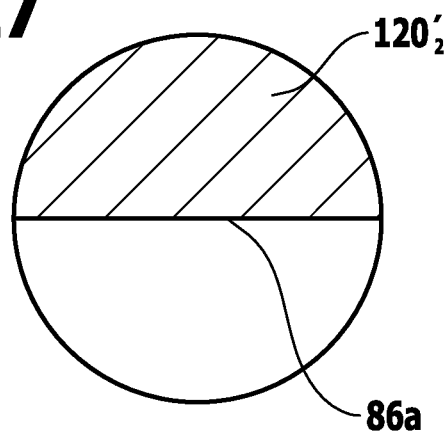
FIG. 17 shows an illustration of the edge image of an edge section of a transverse edge of the object and FIG. 18 shows an illustration of an edge image with simultaneous detection of an edge section of a side edge and an edge section of a transverse edge.

In the simplest case, as illustrated in FIGS. 16 and 17, an edge image of the edge section 82 can be recorded by the edge image $120'_1$ and subsequently an edge image of the edge section 86a by the edge image $120'_2$.

For this purpose the detection area 108 is displaced by moving the edge image detection unit 92 to such an extent that it detects, first of all, for example, only the edge section 82 but not the edge section 86a and subsequently, as a result of travel in X direction, the edge section 86a is detected during travel of the detection area 108 in Y direction.

Figure 18:
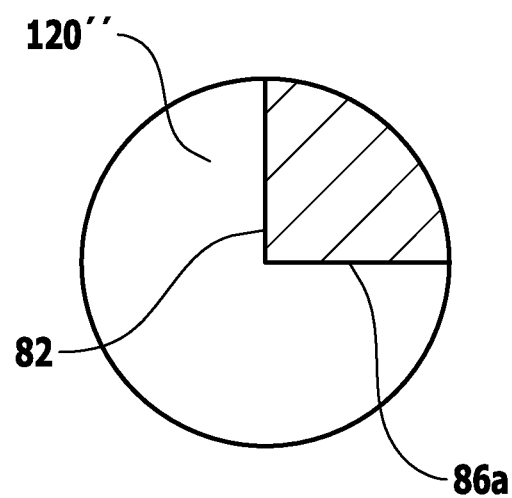

It is, however, also possible, as illustrated in FIG. 18, to record both the edge section 82 and the edge section 86a at the same time with only one edge image 120" and, therefore, to determine the position of the object 30 with its edge sections 82 and 86a by way of a one-time positioning of a detection area 108 both in X direction and also in Y direction, wherein such a determination is also brought about for the edge section 84 and the edge section 86*b* in order to ascertain the alignment of the object 30 with great accuracy.

As for the rest, the fourth embodiment operates in the same way as the preceding embodiments and so reference is made in full to the preceding embodiments with respect to the remaining features.

The invention claimed is:

1. Processing system for plate-like objects, in particular an exposure system for plate-like objects, comprising:
   an exposure device, and
   an object carrier with an object carrier surface for receiving an object, the exposure device and the object carrier being movable relative to one another for the purpose of exposing the object,
   an edge detection device for detecting a position of the object on the object carrier, said edge detection device comprising at least one edge illumination unit arranged in the object carrier beneath the object carrier surface,
   the edge illumination unit having an illumination area in at least one section of a respective object edge area, and within said illumination area an object edge located in the respective object edge area has areally radiated light directed onto it from a side of the object carrier,
   at least one edge image detection unit provided at a distance from the object carrier surface on a side of the object located opposite the object carrier, said at least one edge image detection unit comprising an optical device imaging an edge section of the object edges located in the illumination area onto an image surface as a respective edge image,
   the optical device of the at least one edge image detection unit having a detection area with a smaller surface extension than the respective illumination area,
   the detection area and the illumination areas being movable relative to one another, and
   the respective edge image being detectable in its exact position relative to the object carrier with the at least one edge image detection unit.

2. Processing system as defined in claim 1, wherein the optical device of the at least one edge image detection unit is designed as a telecentric lens.

3. Processing system as defined in claim 1, wherein the image surface is the image surface of an image sensor.

4. Processing system as defined in claim 1, wherein the detection area is movable in a direction transverse to the respective object edge to be detected.

5. Processing system as defined in claim 1, wherein the detection area is movable in a direction of the respective object edge to be detected.

6. Processing system as defined in claim 1, wherein the at least one edge image detection unit and the object carrier are movable relative to one another in at least one direction.

7. Processing system as defined in claim 6, wherein the at least one edge image detection unit and the object carrier are movable relative to one another in two directions extending transversely to one another.

8. Processing system as defined in claim 1, wherein the at least one edge image detection unit records at least one edge section of the object with the respective edge image.

9. Processing system as defined in claim 8, wherein the at least one edge image detection unit records a course of the respective edge section of the object with the respective edge image.

10. Processing system as defined in claim 9, wherein the course of the respective edge section is stored by a control.

11. Processing system as defined in claim 1, wherein:
    the object carrier has an object carrier plate forming the object carrier surface,
    the light from the illumination unit passes through the object carrier plate, and
    the object carrier plate acts as an optical diffuser.

12. Processing system for plate-like objects, in particular an exposure system for plate-like objects, comprising:
    an exposure device, and
    an object carrier with an object carrier surface for receiving an object, the exposure device and the object carrier being movable relative to one another for the purpose of exposing the object,
    an edge detection device for detecting a position of the object on the object carrier, said edge detection device comprising at least one edge illumination unit arranged in the object carrier beneath the object carrier surface,
    the edge illumination unit having an illumination area in at least one section of a respective object edge area, and within said illumination area an object edge located in the respective object edge area has areally radiated light directed onto it from a side of the object carrier,
    at least one edge image detection unit provided at a distance from the object carrier surface on a side of the object located opposite the object carrier, said at least one edge image detection unit imaging an edge section of the object edges located in the illumination area onto an image surface as a respective edge image,
    the respective edge image being detectable in its exact position relative to the object carrier with the at least one edge image detection unit,
    the at least one edge image detection unit recording at least one edge section of the object with the respective edge image,
    the at least one edge image detection unit recording a course of the respective edge section of the object with the respective edge image,
    the course of the respective edge section being stored by a control, and
    the stored course of the respective edge section being used for recognizing the respective edge section again after the object has been placed in position again.

13. Processing system for plate-like objects, in particular an exposure system for plate-like objects, comprising:
    an exposure device, and
    an object carrier with an object carrier surface for receiving an object, the exposure device and the object carrier being movable relative to one another for the purpose of exposing the object,
    an edge detection device for detecting a position of the object on the object carrier, said edge detection device comprising at least one edge illumination unit arranged in the object carrier beneath the object carrier surface,
    the edge illumination unit having an illumination area in at least one section of a respective object edge area,
    the illumination unit comprising a diffuser and at least one light source directing light onto the diffuser for the purpose of illuminating the respective illumination area,
    the at least one light source and the diffuser are integrated in the object carrier,
    within said illumination area an object edge located in the respective object edge area has areally radiated light directed onto it from a side of the object carrier,
    at least one edge image detection unit provided at a distance from the object carrier surface on a side of the object located opposite the object carrier, said at least one edge image detection unit imaging an edge section of the object edges located in the illumination area onto an image surface as a respective edge image, the respective edge image being detectable in its exact position relative to the object carrier with the at least one edge image detection unit.

14. Processing system as defined in claim 13, wherein an optical device of the at least one edge image detection unit has a detection area with a smaller surface extension than the respective illumination area.

15. Processing system as defined in claim 14, wherein the detection area and the illumination areas are movable relative to one another.

* * * * *